(12) United States Patent
Fallah-Adl et al.

(10) Patent No.: US 7,631,133 B2
(45) Date of Patent: Dec. 8, 2009

(54) BACKPLANE INTERCONNECTION SYSTEM AND METHOD

(75) Inventors: Hassan Fallah-Adl, Chandler, AZ (US); Edoardo Campini, Mesa, AZ (US); David Formisano, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 66 days.

(21) Appl. No.: 11/395,906

(22) Filed: Mar. 31, 2006

(65) Prior Publication Data

US 2007/0233927 A1    Oct. 4, 2007

(51) Int. Cl.
*G06F 13/00* (2006.01)
*H04L 12/56* (2006.01)
*H04L 12/00* (2006.01)

(52) U.S. Cl. .............. 710/301; 710/316; 370/355; 370/357; 370/362; 370/386; 370/406

(58) Field of Classification Search ............ 710/104, 710/301, 107, 316; 370/355, 357, 362, 386, 370/406, 425
See application file for complete search history.

(56) References Cited

U.S. PATENT DOCUMENTS

| | | | |
|---|---|---|---|
| 6,320,863 B1 * | 11/2001 | Ramfelt ................ | 370/404 |
| 6,693,901 B1 * | 2/2004 | Byers et al. ............ | 370/362 |
| 7,039,732 B1 * | 5/2006 | House .................... | 710/100 |
| 7,083,422 B2 * | 8/2006 | Campini et al. ........ | 439/61 |
| 2003/0123441 A1 * | 7/2003 | Singh et al. ............ | 370/392 |
| 2003/0169577 A1 * | 9/2003 | Linares et al. ......... | 361/788 |
| 2003/0208648 A1 * | 11/2003 | Linares et al. ......... | 710/300 |
| 2003/0235042 A1 * | 12/2003 | Harris et al. ........... | 361/752 |
| 2004/0003154 A1 * | 1/2004 | Harris et al. ........... | 710/300 |
| 2004/0022022 A1 * | 2/2004 | Voge ..................... | 361/684 |
| 2004/0042448 A1 * | 3/2004 | Lebizay et al. ......... | 370/362 |
| 2004/0236867 A1 * | 11/2004 | Lanus et al. ........... | 709/238 |
| 2005/0226168 A1 * | 10/2005 | Busch et al. ........... | 370/254 |
| 2005/0227505 A1 | 10/2005 | Campini et al. | |
| 2005/0268009 A1 * | 12/2005 | Tufford et al. ......... | 710/100 |
| 2006/0004837 A1 * | 1/2006 | Genovker et al. ...... | 707/102 |
| 2006/0015666 A1 * | 1/2006 | Wolfe et al. ........... | 710/104 |
| 2007/0047535 A1 * | 3/2007 | Varma .................... | 370/360 |

FOREIGN PATENT DOCUMENTS

| EP | 1633178 | 3/2006 |
|---|---|---|
| JP | 2002-044058 | 2/2002 |
| WO | 2006004780 A1 | 1/2006 |

OTHER PUBLICATIONS

International Search Report and Written Opinion for application No. PCT/US2007/064723, (Aug. 21, 2007), 10 pgs.

\* cited by examiner

*Primary Examiner*—Glenn A Auve
(74) *Attorney, Agent, or Firm*—Grossman, Tucker, Perreault & Pfleger, PLLC

(57) ABSTRACT

An apparatus, method, computer program product, integrated circuit and system that include a backplane that provides direct and indirect connections among a plurality of slots in communication with the backplane. The backplane is also complies with a telecommunication architecture specification. The slots include at least a source slot, an intermediate slot and a destination slot. The intermediate slot may receive a first data set from the source slot via the backplane. The intermediate slot sends the first data set to the destination slot via the backplane.

20 Claims, 5 Drawing Sheets

BACKPLANE INTERCONNECTION SYSTEM AND METHOD

TECHNICAL FIELD

This disclosure relates to backplane architectures and, more particularly, to interconnecting a plurality of circuit boards with a backplane.

BACKGROUND

In some telecommunication equipment, a plurality of circuit boards (also referred to as blades) may be connected to a common circuit board (also referred to as a backplane). Typically, a backplane includes circuitry for interconnecting the blades. By interconnecting the blades to one another, data may be passed directly from a source blade to one or more destination blades. Some backplanes are designed to comply with one or more standards, such as the Advanced Telecommunications Computer Architecture (ATCA) specification. By complying with the ATCA specification, the number of backplane connectors for interconnecting blades may be limited. By constraining the number of connectors, many, if not all, of the backplane connectors may be consumed to provide the direct interconnectivity between the blades. Thus, a limited number (or no) backplane connectors may available for establishing dedicated higher speed connections.

BRIEF DESCRIPTION OF THE DRAWINGS

The details of one or more implementations of this disclosure are set forth in the accompanying drawings and the description below. Other features and advantages will become apparent from the description, the drawings, and the claims.

Although the following Detailed Description will proceed with reference being made to illustrative embodiments, many alternatives, modifications, and variations thereof will be apparent to those skilled in the art. Accordingly, it is intended that the claimed subject matter be viewed broadly, and be defined only as set forth in the accompanying claims

DETAILED DESCRIPTION OF THE PREFERRED EMBODIMENTS

Figure 1:
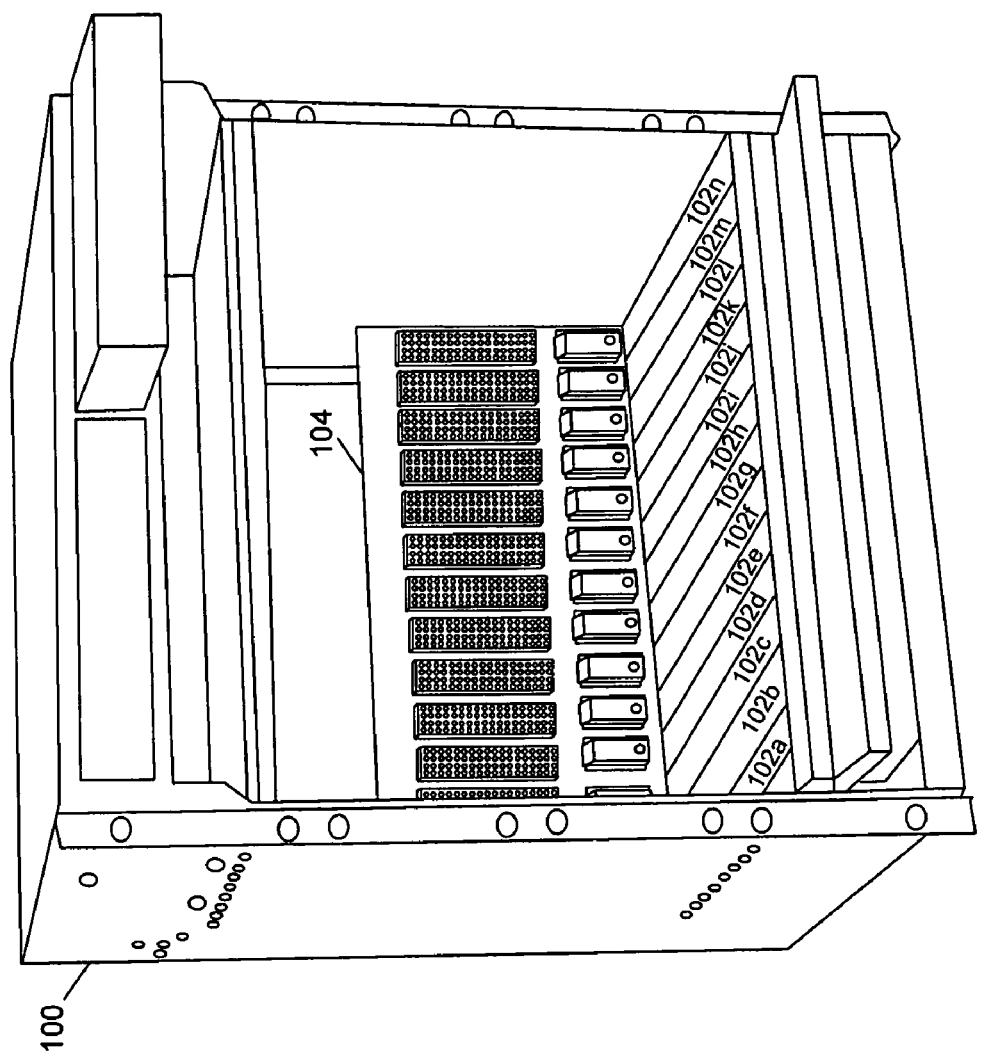
FIG. 1 is a diagrammatic view of one embodiment of a chassis that complies with the ATCA specification.

Referring to FIG. 1, a rack-mountable chassis 100 is shown that complies with the Peripheral Component Interconnect (PCI) Industrial Computer Manufacturer Group (PICMG) Advanced Telecommunications Computing Architecture (ATCA). The PICMG 3.0® ATCA specification was approved on 30 Dec. 2002 by the PICMG® Executive Membership and published in January 2003 as guidelines for the design of the AdvancedTCA™ compliant boards and system.

Chassis 100 may include a number of slots that may be capable of receiving circuit boards such as blades for telecommunication applications. In this embodiment, chassis 100 may include fourteen slots 102a-n to comply with the ATCA specification. Circuit boards (e.g., blades) may be appropriately placed in each of slots 102a-n and connected to a backplane 104 via respective connectors included in the backplane. Backplane 104 may include circuitry for interconnecting some or all of slots 102a-n. For example, a blade connected into slot 102a may be interconnected with each of the other individual slots 102b-n via the circuitry included in backplane 104.

As mentioned above, chassis 100, and in particular backplane 104, may be compliant with the ATCA design specification that is described in PCI Industrial Computer Manufacturers Group (PICMG), Advanced Telecommunications Computing Architecture (ATCA) Base Specification, PICMG 3.0 Rev. 2.0, published Mar. 18, 2005, and/or later versions of the specification ("the ATCA specification"), which are incorporated by reference herein. However, in other embodiments, chassis 100 and/or backplane 104 may comply with one or more other design specifications. For example, the architecture of backplane 104 may be compliant with Advanced Telecommunications Computing Architecture 300 (ATCA300), Micro Telecommunications Computing Architecture (MicroTCA), VersaModular Eurocard (VME) bus standard, BladeCenter specification, CompactPCI™, or other type of telecommunication design specification or combination of design specifications.

Figure 2:
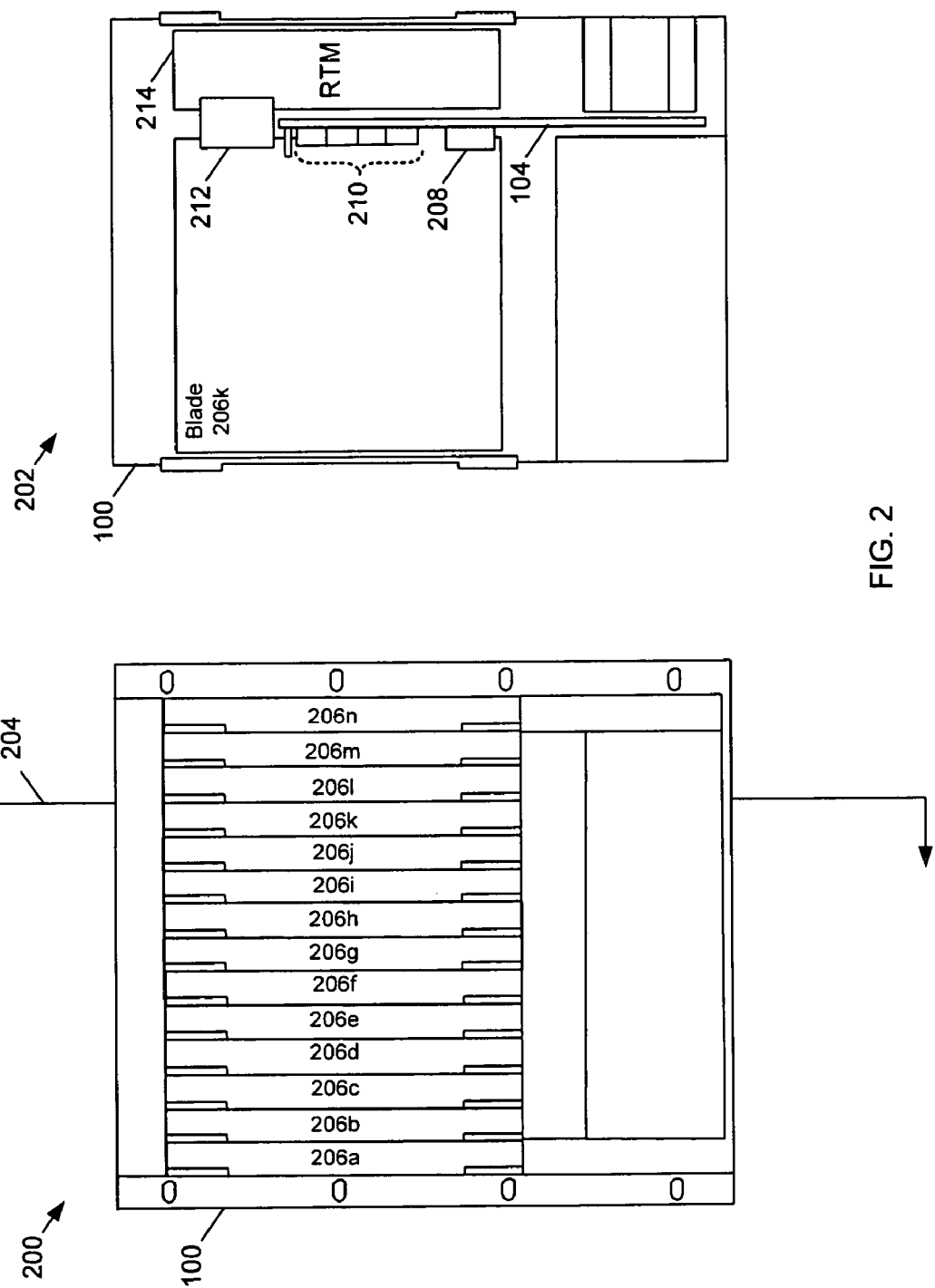
FIG. 2 is a front and side view of the chassis of FIG. 1.

Referring to FIG. 2, a front view 200 of chassis 100 is shown. Additionally, an interior side view 202 of chassis 100 is shown as cut along an axis 204. Front view 200 illustrates that all fourteen slots 102a-n may be populated with respective blades 206a-n. However, in other embodiments other types of circuit boards may be used to populate one or more of slots 102a-n. As illustrated in side view 202, each blade may be connected to backplane 104 via two connectors. For example, a connector 208 may be used to provide power and management signals from backplane 104 to blade 206k. In some ATCA architectures, connector 208 may be referred to as a zone 1 connector. A connector 210 allows data to be passed between blade 206k and the other blades 206a-j and 206l-n via backplane 104. As described in detail below, various types of interconnections schemes may be implemented for connecting blades 206a-n. In some ATCA architectures, connector 210 may include multiple connector pins and may be referred to as a zone 2 connector. In this particular embodiment additional connectivity is provided by a connector 212 that connects blade 206k to a rear transition module (RTM) 214. In some ATCA architectures, connector 212 may be referred to as a zone 3 connector.

To pass data among the blades 206a-n, one or more interconnection schemes may be incorporated into backplane 104. For one interconnection scheme, each blade may be directly connected to each of the other blades. For example, blade 206k may be directly connected to each of the other blades 206a-j and 206l-n. To provide these interconnections, connector 210 may includes a plurality of connector pins in which one or more pins are dedicated to provide a direct connection to a connection pin (or pins) included in a counterpart connector associated with another slot. Thus, a dedicated data passing channel may be established between each pair of slots. As shown below, by dedicating a channel between each slot pair, a substantial number of connecting pins included in connector 210 (and counterpart connectors) may be allocated to these channels. Thus, additional pins may not be available for establishing other connections. For example, additional connections between blades may be desirable for producing one or more channels with comparably larger bandwidth and/or higher transmission speeds.

However, without available connector pins, these large bandwidth and/or high transmission speed channels may not be realizable.

Figure 3:
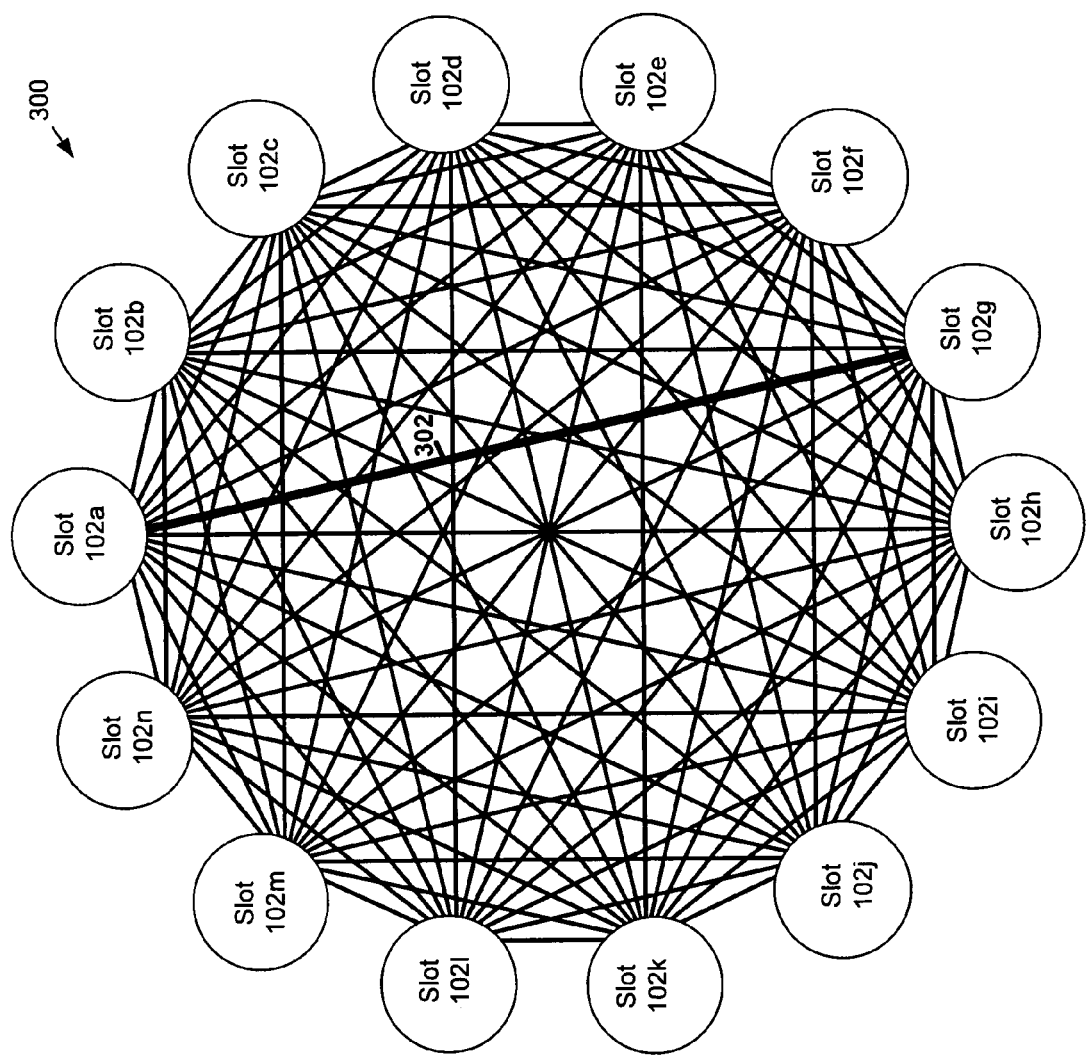
FIG. 3 is a representation of a full mesh for interconnecting slots included in the chassis of FIG. 1.

Referring to FIG. 3, a graphical representation 300 illustrates an interconnection scheme in which a dedicated connection is assigned to each slot pair. Thus, for the embodiment of fourteen slots 102a-n, thirteen connections are associated with each slot in order to provide a dedicated connection for each pair of slots. For example, as highlighted by bold line, connectors associated with slot 102a and slot 102g include connector pins that respectively provide a direct connection 302 between the slots. By directly connecting each pair of slots (e.g., slot 102a and slot 102g) a connection scheme referred to as a full mesh in produced. To implement a full mesh connection scheme, a considerable amount of hardware (e.g., connectors, conducting traces, wire, etc.) may need to be incorporated into backplane 104. For example, a considerable number of connectors and conductors may be allocated to each slot 102a-n to implement a full mesh. Considerable hardware may also be needed at each slot to produce the full mesh. For example, a switch (or multiple switches) may be included in each blade that is inserted into a slot. Each switch may be used to select the destination slot (or slots) to be connected to the source slot. In this fourteen slot embodiment, each blade may include a thirteen position switch for establishing a connection between the blade (where the switch is located) and each of the other blades. This hardware may substantially increase the development and production cost of backplane 104.

A full mesh interconnection scheme may also limit the throughput bandwidth between the slots. For example, to allocate a dedicated connection between each possible slot pair, a considerable amount of connection pins may be needed. For some high performance applications, one or more slot pairs may need relatively large bandwidth interconnections. To increase the bandwidth, additional dedicated connections may be incorporated into the full mesh. For example, to add a larger bandwidth connection between slot 102a and 102g, one or more connections (in addition to connection 302) may be incorporated into backplane 104. However, since a considerable number of connection pins may be needed to form the full mesh, few, if any, connection pins may be available for the large bandwidth connections. Thus, by limiting the number of available connection pins associated with each slot, some high performance applications may not be executable with the full mesh implemented in backplane 104. By reducing the number of connections needed by each slot, additional connection pins may be available for establishing higher performance connections.

Figure 4:
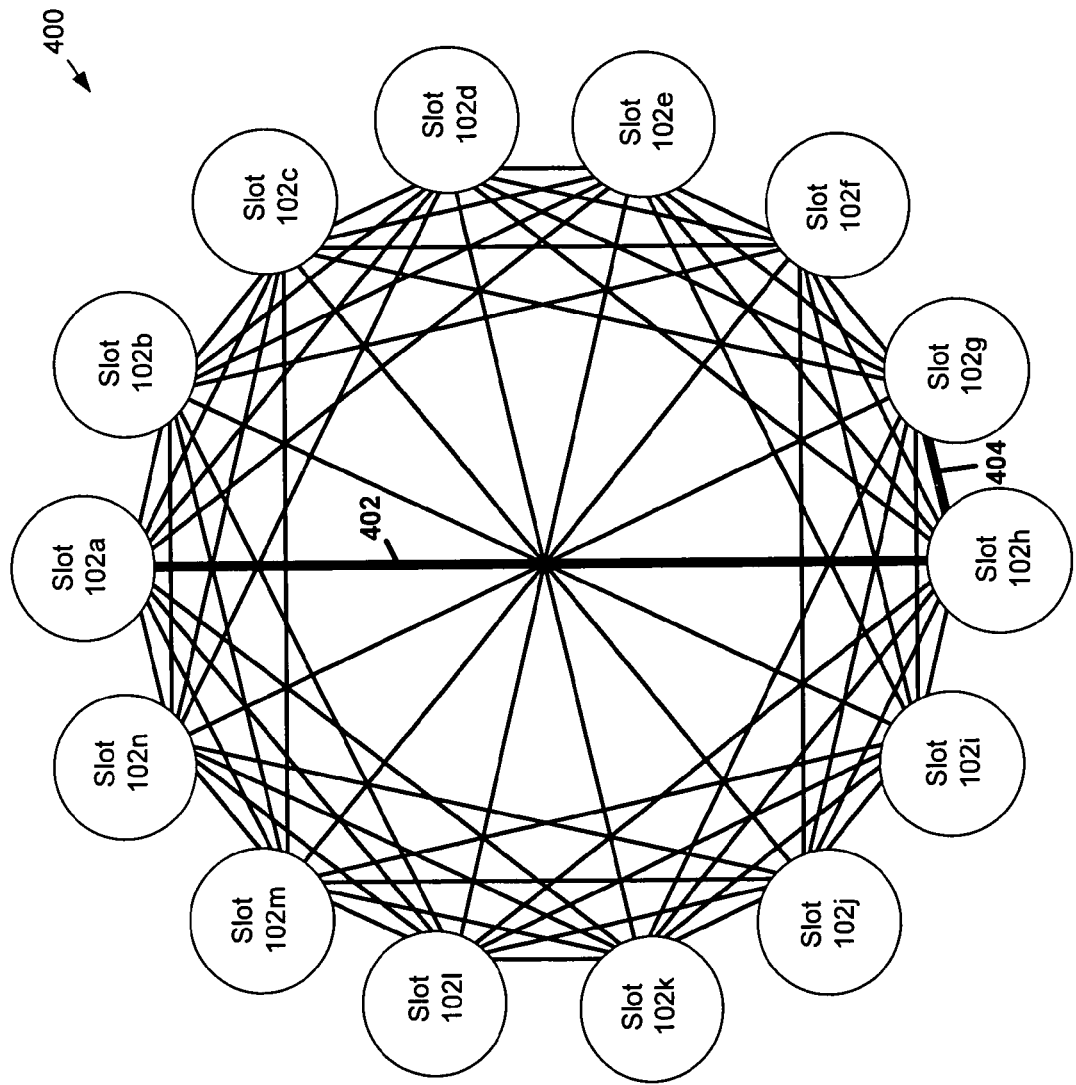
FIG. 4 is a representation of a sparse mesh for interconnecting the slots of the chassis of FIG. 1.

Referring to FIG. 4, a graphical representation is presented of an interconnection scheme in which direct and indirect connections are used to establish communication between each pair of slots. By using indirect connections each slot does not need to directly communicate with each of the other slots. This interconnection scheme may be referred to as a sparse mesh. To provide an indirect connection, one or more intermediate slots may be used to establish a connection between a slot pair. For example, in this embodiment there is no direct connection between slot 102a and 102g. To establish a connection between these two slots, slot 102h serves as an intermediate slot. So, if slot 102a needs to send data (i.e., is a source slot) to slot 102g, the data is first sent over a connection 402 to intermediate slot 102h. The received data may then be sent from intermediate slot 102h to slot 102g (i.e., the destination slot) over a connection 404. By using slot 102h as an intermediate slot, the sparse mesh interconnection scheme needs less direct connections in comparison to the full mesh interconnection scheme (shown in FIG. 3). Additionally, since each slot does not need to connect directly to each other slot, the number of switch positions is reduced. For example, each slot in FIG. 3 is capable of connecting with one of the thirteen other slots. Thus each slot is associated with one or more switches that provide thirteen connection positions. For example, each blade (inserted into each slot) may include a thirteen-position switch for establishing a direct connection with each potential destination blade. In contrast, less switch positions may be needed for the sparse mesh represented in FIG. 4. In this embodiment each slot is connected to nine other slots in the sparse mesh. While there are less direct slot-to-slot connections, by using intermediate slots, each slot may still establish a connection with any of the other slots. For example, to transmit data from slot 102a to 102g, data may be provided to intermediate slot 102h. In particular, data is first sent from source slot 102a to intermediate slot 102h over connection 402. Intermediate slot 102h next sends the data to the destination slot 102g over connection 404. Each of the slots may operate as source, intermediate and/or destination slots. For example, along with operating as an intermediate slot, slot 102h may operate as a source and/or a destination slot.

By using a sparse mesh for interconnecting slots 102a-n, less hardware may be needed for implementation. For example, fewer conductors may be needed since each slot does not need to be in direct connection with each of the other slots. Additionally, the switches associated with each slot may include fewer positions. As shown in this embodiment, each switch associated with each slot may have nine positions. Although, in other embodiments the one or more of the switches may have more or less switch positions. For example, some switches may have as few as two positions or as many as thirteen positions. The number of switch positions may or may not be uniformly distributed. For example, slots associated with high speed application blades may have fewer switch positions than blades that need less bandwidth.

By implementing a sparse mesh into a backplane, less (if any) switching blades may be needed to be inserted into one or more slots of the ATCA chassis. The interconnectivity of the spare mesh provides the switching functionality of one or more switching blades used in some topologies (e.g., a dual star topology). By providing the switching functionality via the backplane that implements a sparse mesh and circuitry (e.g., one or more switches) included in the blades themselves, switching blades dedicated to providing switching functionality may not be needed. Thereby additional slots may be available in the chassis for other blades or other types of circuit board types.

By implementing a sparse mesh more connection pins may be available for higher performance applications. For example, since only nine direct connections are made by each slot (compared to thirteen connections associated with each slot in FIG. 3), more connection pins may be available. The available connection pins may be used for establishing one or more high performance (e.g., large bandwidth, high speed, etc.) connections for particular applications. For example, the additional available pins may be used to establish a high speed connection between a controller card (e.g., inserted into slot 102a) and an Input/Output (I/O) card (e.g., inserted into slot 102b). Meanwhile, a relatively slower speed connection (e.g., connection 402) may be used to connect the controller card to an audio card (e.g., inserted into slot 102h). Furthermore, by reducing the number of direct connections, development and production cost may be reduced.

While the graphical representation 400 illustrates the interconnection of fourteen slots, in other embodiments more or less slots may be incorporated. For example, the number of slots may be limited to eight slots for a MicroTCA architecture. A sparse mesh may be incorporated for interconnecting the eight slots. Various types of sparse meshes may be implemented. For example, sparse meshes may be implemented such that each slot is directly connected to the slot's two (or more) nearest neighbors and/or to the slot's two (or more) furthest neighbors. Redundancy may also be incorporated into the sparse mesh. For example, one slot may incorporate two (or more) direct connections to one or more the other slots. Additionally, two or more sparse meshes may be implemented. By using one or more sparse meshes, a flexible backplane may be designed at a reduced cost while not exceeding power and/or real estate budgets or needing overly complex switch designs. Additionally a sparse mesh allows bandwidth increases and may reduce the number of slots dedicated exclusively to switching operations.

Figure 5:
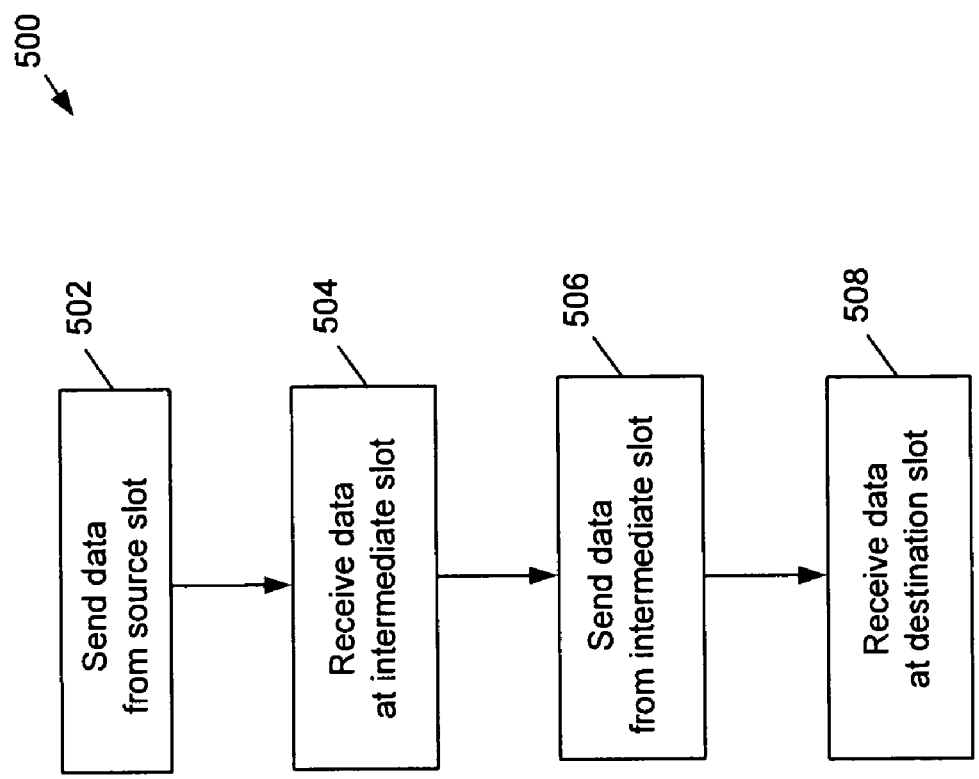
FIG. 5 is a flowchart of a process for passing data among the slots interconnected by the sparse mesh represented in FIG. 4.

Referring to FIG. 5, a flowchart 500 is shown that represents some of the operations of a source slot (e.g., slot 102a), intermediate slot (e.g., slot 102g) and a destination slot (e.g., 102h). For example, some operations may include the source slot sending 502 data to the intermediate slot in order for the data to be passed to the destination slot. Operations may also include the intermediate slot receiving 504 the data. One or more of these slots (i.e., source slot, intermediate slot and/or the destination slot) may be included in a sparse mesh such as the sparse mesh represented in FIG. 4. Additionally, the data may be sent to two or more intermediate slots for delivery to one or more destination slots. Operations may also include the intermediate slot sending 506 the data to one or more destination slots. In some embodiments, the intermediate slot may send the data to another intermediate slot for delivery to the one or more destination slots. Operations may also include the data being received 508 at the destination slot.

In the embodiments described above hardware connections (e.g., connector) and conductors associated with backplane 104 may be used for transferring data among slots 102a-n. In some embodiments to control the transfer of data, one or more processors may execute instructions to perform the operations represented in FIG. 5. For example, backplane 104 and/or one or more blades may include one or more general processors (e.g., a microprocessor) and/or one or more specialized devices (e.g., an application specific integrated circuit (ASIC), etc.). One or more of the processors may be implemented in a single integrated circuit as a monolithic structure or in a distributed structure. In some embodiments the instructions that are executed by the processors may reside in a memory (e.g., random access memory (RAM), read-only memory (ROM), static RAM (SRAM), etc.) that is located on backplane 104, one or more of the blades, and/or at a remote location. The instructions may also be stored on one or more mass storage devices (e.g., magnetic, magneto-optical disks, or optical disks, etc.) that are in communication with chassis 100.

One or more of the operations associated with flowchart 500 may be performed by one or more programmable processors (e.g., a microprocessor, an ASCI, etc.) executing a computer program. The execution of one or more computer programs may include operating on input data (e.g., data provided from a source external to chassis 100, etc.) and generating output (e.g., sending data to a destination external to the chassis 100, etc.). The operations may also be performed by a processor implemented as special purpose logic circuitry (e.g., an FPGA (field programmable gate array), an ASIC (application-specific integrated circuit), etc.).

Operation execution may also be executed by digital electronic circuitry, or in computer hardware, firmware, software, or in combinations of them. The operations described in flowchart 500 may be implemented as a computer program product, e.g., a computer program tangibly embodied in an information carrier, e.g., in a machine-readable storage device (e.g., RAM, ROM, hard-drive, CD-ROM, etc.) or in a propagated signal. The computer program product may be executed by or control the operation of, data processing apparatus, e.g., a programmable processor, a computer, or multiple computers. A computer program may be written in one or more forms of programming languages, including compiled or interpreted languages, and it can be deployed in any form, including as a stand-alone program or as a module, component, subroutine, or other unit suitable for use in a computing environment. A computer program may be deployed to be executed on one computing device (e.g., controller, computer system, etc.) or on multiple computing devices (e.g., multiple controllers) at one site or distributed across multiple sites and interconnected by a communication network.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. An apparatus comprising:
   a backplane including slot connectors and conductors extending directly between some of the slot connectors forming a sparse mesh interconnection scheme to provide direct and indirect connections among a plurality of slots in communication with the backplane with at least some of the plurality of slots being directly connected to more than two others of the plurality of slots but without any of the plurality of slots being directly connected to all of the plurality of slots, wherein the direct connections are provided between slots having conductors extending directly therebetween, wherein the conductors extend between each of the slots and at least two nearest neighbor slots and at least two farthest neighbor slots to provide direct connections therebetween, wherein the backplane complies with a telecommunication architecture specification, wherein each of the plurality of slots is capable of operating as a source slot to send a first data set via the backplane, an intermediate slot to receive the data set from a source slot via the backplane and to send the data set via the backplane and a destination slot to receive the data set from an intermediate slot via the backplane, and wherein the indirect connections are provided between a source slot and a destination slot via an intermediate slot.

2. The apparatus of claim 1, wherein the backplane complies with an Advanced Telecommunications Computing Architecture (ATCA) specification.

3. The apparatus of claim 1, wherein the backplane complies with a Micro Telecommunications Computing Architecture (MicroTCA) specification.

4. The apparatus of claim 1, wherein the backplane complies with a VersaModular Eurocard (VME) bus standard.

5. The apparatus of claim 1, wherein the backplane complies with a BladeCenter specification.

6. The apparatus of claim 1, wherein the backplane complies with a CompactPCI™ specification.

7. The apparatus of claim 1 wherein some of the plurality of slots include more conductors extending therebetween than other of the plurality of slots to provide higher bandwidth connections.

8. A method comprising:
receiving a first set of data at a first intermediate slot from a source slot via a backplane having a sparse mesh interconnection scheme that provides direct and indirect connections among a plurality of slots in communication with the backplane without any of the plurality of slots being directly connected to all of the plurality of slots, wherein conductors extend between each of the slots and at least two nearest neighbor slots and at least two farthest neighbor slots to provide direct connections therebetween;
sending the first set of data from the first intermediate slot to a first destination slot via the backplane, wherein the source slot is indirectly connected to the first destination slot without using a dedicated switching blade; and
sending a second set of data from the source slot to a second destination slot via the backplane, wherein the second set of data is sent at a higher speed than the first set of data.

9. The method of claim 8, wherein sending the first set of data from the first intermediate slot to the destination slot includes sending the first set of data to a second intermediate slot via the backplane.

10. The method of claim 8, wherein the second set of data is sent over a dedicated connection between the source slot and the second destination slot.

11. An article comprising a storage medium having stored thereon instructions that when executed by a machine result in the following:
receiving a first set of data at a first intermediate slot from a source slot via a backplane having a sparse mesh interconnection scheme that provides direct and indirect connections among a plurality of slots in communication with the backplane without any of the plurality of slots being directly connected to all of the plurality of slots, wherein conductors extend between each of the slots and at least two nearest neighbor slots and at least two farthest neighbor slots to provide direct connections therebetween;
sending the first set of data from the first intermediate slot to a first destination slot via the backplane, wherein the source slots is indirectly connected to the first destination slot without using a dedicated switching blade; and
sending a second set of data from the source slot to a second destination slot via the backplane, wherein the second set of data is sent at a higher speed than the first set of data.

12. The article of claim 11, wherein sending the first set of data from the first intermediate slot to the destination slot includes sending the first set of data to a second intermediate slot via the backplane.

13. An integrated circuit capable of:
receiving a first set of data at a first intermediate slot from a source slot via a backplane having a sparse mesh interconnection scheme that provides direct and indirect connections among a plurality of slots in communication with the backplane without any of the plurality of slots being directly connected to all of the plurality of slots, wherein conductors extend between each of the slots and at least two nearest neighbor slots and at least two farthest neighbor slots to provide direct connections therebetween;
sending the first set of data from the first intermediate slot to a first destination slot via the backplane, wherein the source slot is indirectly connected to the first destination slot without using a dedicated switching blade; and
sending a second set of data from the source slot to a second destination slot via the backplane, wherein the second set of data is sent at a higher speed than the first set of data.

14. The integrated circuit of claim 13, wherein sending the first set of data from the first intermediate slot to the destination slot includes sending the first set of data to a second intermediate slot via the backplane.

15. A system comprising:
a chassis comprising:
a plurality of slots for receiving circuit boards, wherein each of the plurality of slots is capable of operating as a source slot to send a data set, an intermediate slot to receive the data set from a source slot and to send the data set, and a destination slot to receive the data set from an intermedicate slot; and
a backplane including conductors extending directly between some of the plurality of slots forming a sparse mesh interconnection scheme to provide direct and indirect connections for communicating with each of the plurality of slots with at least some of the plurality of slots being directly connected to more than two others of the plurality of slots but without any of the plurality of slots being directly connected to all of the plurality of slots, wherein the direct connections are provided between slots having conductors extending directly therebetween, wherein the conductors extend between each of the slots and at least two nearest neighbor slots and at least two farthest neighbor slots to provide direct connections therebetween, and wherein the indirect connections are provided between a source slot and a destination slot via an intermediate slot.

16. The system of claim 15, wherein the backplane complies with an Advanced Telecommunications Computing Architecture (ATCA) specification.

17. The system of claim 15, wherein the backplane complies with a Micro Telecommunications Computing Architecture (MicroTCA) specification.

18. The system of claim 15, wherein the backplane complies with a VersaModular Eurocard (VME) bus standard.

19. The system of claim 15, wherein the backplane complies with a BladeCenter specification.

20. The system of claim 15, wherein the backplane complies with a CompactPCI™ specification.

* * * * *